(12) United States Patent
Mittal et al.

(10) Patent No.: US 9,177,963 B2
(45) Date of Patent: Nov. 3, 2015

(54) FORMING A LOW VOTAGE ANTIFUSE DEVICE AND RESULTING DEVICE

(71) Applicant: GLOBALFOUNDRIES Inc., Grand Cayman (KY)

(72) Inventors: Anurag Mittal, Saratoga Springs, NY (US); Marc Tarabbia, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 145 days.

(21) Appl. No.: 14/082,263

(22) Filed: Nov. 18, 2013

(65) Prior Publication Data

US 2015/0137258 A1    May 21, 2015

(51) Int. Cl.
*H01L 27/112* (2006.01)
*H01L 29/66* (2006.01)
*H01L 29/78* (2006.01)

(52) U.S. Cl.
CPC .... *H01L 27/11206* (2013.01); *H01L 29/66795* (2013.01); *H01L 29/785* (2013.01)

(58) Field of Classification Search
CPC .................. H01L 27/11206; H01L 29/7856
See application file for complete search history.

(56) References Cited

PUBLICATIONS

Kulkarni et al., "A 32nm High-k and Metal-Gate Anti-Fuse Array Featuring a 1.01um 1T1C Bit Cell," Logic Technology Development, Intel Corporation, Hillsboro, OR, USA, IEEE Symposium on VLSI Technology Digest of Technical Papers, pp. 79-80, 2012.
Peng et al., "A Novel Embedded OTP NVM Using Standard Foundry CMOS Logic Technology," IEEE NVSMW, pp. 24-26, 2006.
Wee et al., "Antifuse Circuits and Their Applications to Post-Package of DRAMs," Journal of Semiconductor Technology and Science, vol. 1, No. 4, Dec. 2001, pp. 216-231.
www.kilopass.com/about/partners/foundry-partners/, Kilopass Technology, retrieved Dec. 17, 2013.

*Primary Examiner* — David Vu
(74) *Attorney, Agent, or Firm* — DITTHAVONG & STEINER, P.C.

(57) ABSTRACT

Methods for a low voltage antifuse device and the resulting devices are disclosed. Embodiments may include forming a plurality of fins above a substrate, removing a portion of a fin, forming a fin tip, forming a first area of a gate oxide layer above at least the fin tip, forming a second area of the gate oxide layer above a remaining portion of the plurality of fins, wherein the first area is thinner than the second area, and forming a gate over at least the fin tip to form an antifuse one-time programmable device.

20 Claims, 9 Drawing Sheets

FORMING A LOW VOTAGE ANTIFUSE DEVICE AND RESULTING DEVICE

TECHNICAL FIELD

The present disclosure relates to one-time programmable (OTP) memory. The present disclosure is particularly applicable to forming OTP memory requiring a low programming voltage for 20 nanometer (nm) technology nodes and beyond.

BACKGROUND

Consumer electronic device manufacturers and wireless markets are under heavy pressure to reduce costs, increase performance, minimize power consumption, and increase security. Configurability and programmability can aid in achieving these goals. One-time programmable (OTP) memory is one approach that enables configurability and programmability. OTP memory that is area efficient, requires low power, and has high performance, while being reliable and secure may afford a particular OTP memory solution. OTP memory that does not require a high voltage from a charge pump or external power supply may prove particularly useful in achieving the goals. Further, an antifuse device is one type of OTP memory that is programmed by applying an electrical stress that creates a low resistance conductive path, such as a short. Such a short may be achieved by the breakdown of an oxide layer. However, controlling the location of the breakdown in the oxide is critical to reduce electrical variability of the shorted structure.

A need, therefore, exists for methodology for forming an antifuse OTP memory with a low programming voltage, and the resulting device.

SUMMARY

An aspect of the present disclosure is a method for forming a low programming voltage antifuse device.

Another aspect of the present disclosure is a low programming voltage antifuse device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a plurality of fins above a substrate, removing a portion of a fin, forming a fin tip, forming a first area of a gate oxide layer above at least the fin tip, forming a second area of the gate oxide layer above a remaining portion of the plurality of fins, wherein the first area is thinner than the second area, and forming a gate over at least the fin tip to form an antifuse OTP device.

An aspect of the present disclosure includes forming the second area to a thickness of 30 to 70 Angstroms (Å). Another aspect includes forming the first area to a thickness of 10 to 15 Å. A further aspect includes removing the portion of the fin using a corner rounding cut mask. Yet another aspect includes a lower breakdown voltage of the gate oxide layer at the fin tip, being closer to the technology node logic nominal voltage as compared to the technology node IO voltage. Still another aspect includes forming the gate to a width of 70 to 150 nm. An additional aspect includes forming the gate over the first area of the gate oxide layer above the fin tip. An aspect also includes forming the second area of the gate oxide layer of a high-k dielectric and a non-high-k dielectric. Yet another aspect includes forming the first area of the gate oxide layer of the high-k dielectric.

Another aspect of the present disclosure is a device including: a substrate, a plurality of fins above the substrate, at least one fin including a fin tip, a gate oxide layer, the gate oxide layer including a first area above at least the fin tip and a second area above a remaining portion of the plurality of fins, wherein the first area is thinner than the second area, and a gate over the fin tip.

An aspect includes the second area having a thickness of 30 to 70 Å. Another aspect includes the first area having a thickness of 10 to 15 Å. Yet another aspect includes the fin tip including an oblique-angled end of the fin. Still another aspect includes the fin tip formed based on a corner rounding cut mask. An additional aspect includes the gate having a width of 70 to 150 nm. Still an additional aspect includes the gate formed over the first area of the gate oxide layer above the fin tip. Yet another aspect includes the second area of the gate oxide layer formed of a high-k dielectric and a non-high-k dielectric. An additional aspect includes the first area of the gate oxide layer formed of the high-k dielectric.

Another aspect of the present disclosure is a method including: forming a plurality of fins above a substrate, removing a portion of a fin, forming a fin tip, forming a first oxide layer over a first area and a second area, the first area covering at least the fin tip and the second area covering remaining fins of the plurality of fins, forming a mask over the second area, removing the first oxide layer in the first area, forming a second oxide layer over the first area and the second area, and forming a plurality of gates over the substrate and the plurality of fins, at least one gate formed over the fin tip forming an antifuse OTP device.

Additional aspects include forming the gate to a width of 70 to 150 nm, and removing the portion of the fin using a single corner rounding cut mask, wherein the second oxide layer is formed of a high-k dielectric, and a breakdown voltage of the gate oxide layer at the fin tip being closer to the technology node logic nominal voltage and not needing the transmission or application of a higher voltage such as the technology node IO voltage by design.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of the requirement for large programming voltages attendant upon OTP antifuse devices. In accordance with embodiments of the present disclosure, fin field-effect transistor (FinFET) technology is used to create a lower programming voltage OTP memory.

Methodology in accordance with an embodiment of the present disclosure includes forming a plurality of fins above a substrate and removing a portion of a fin, forming a fin tip. A first area of a gate oxide is then formed above the fin tip, followed by a second area of the gate oxide layer formed above a remaining portion of the plurality of fins, with the first area being thinner than the second area. A gate is then formed over at least the fin tip to form an antifuse OTP device that requires low programming voltage.

Figure 1:
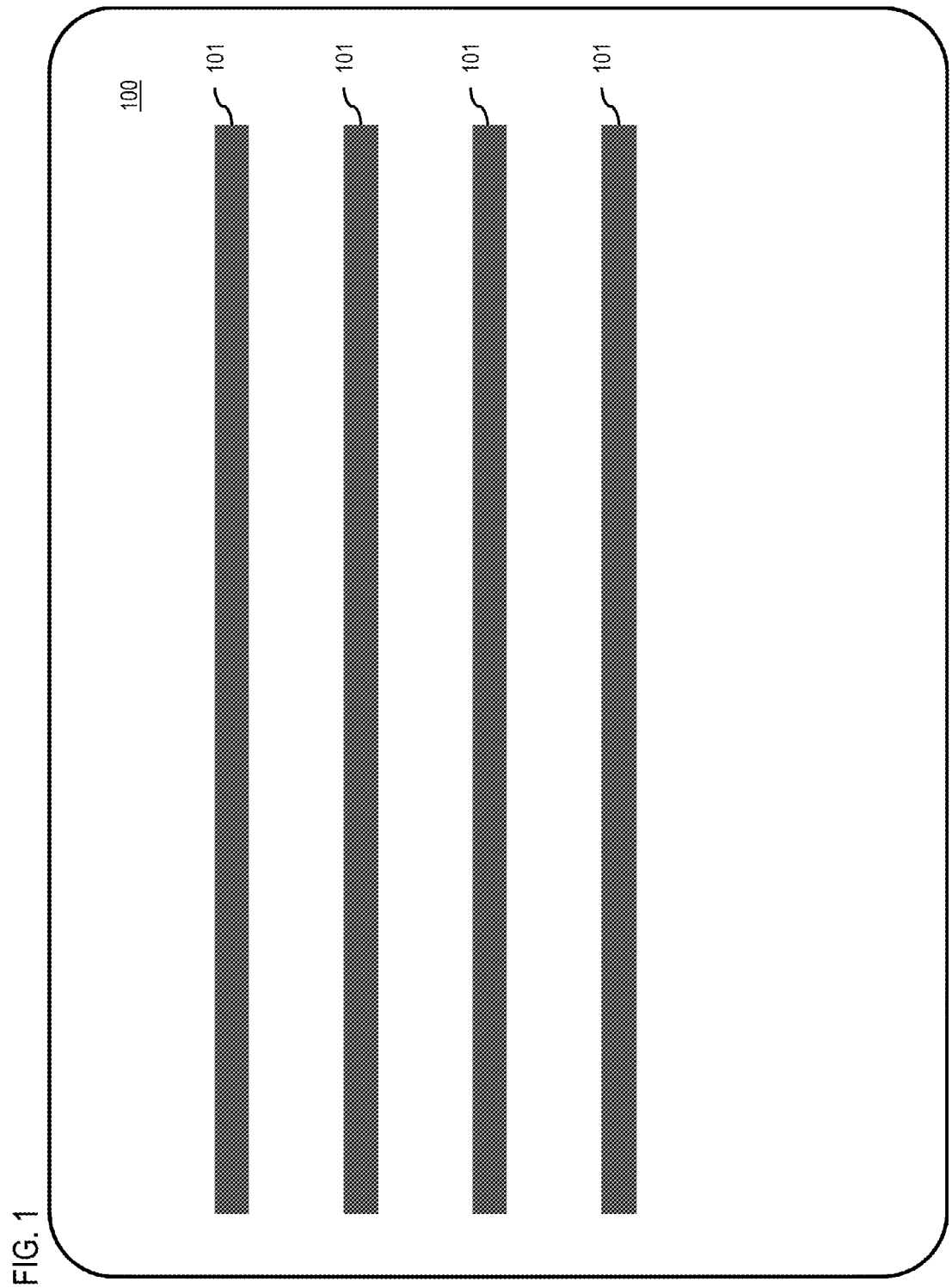
FIGS. 1 through 9 schematically illustrate a method for forming a low programming voltage antifuse device, in accordance with an exemplary embodiment.

Adverting to FIG. 1, a method for forming a low programming voltage antifuse device, according to an exemplary embodiment, begins with a substrate 100. The substrate can be any type of semiconductor substrate, such as silicon (Si), silicon germanium (SiGe), etc. Fins 101 are formed on the substrate 100 for forming FinFETs. The fins 101 can be formed according to any conventional processing.

Figure 2:
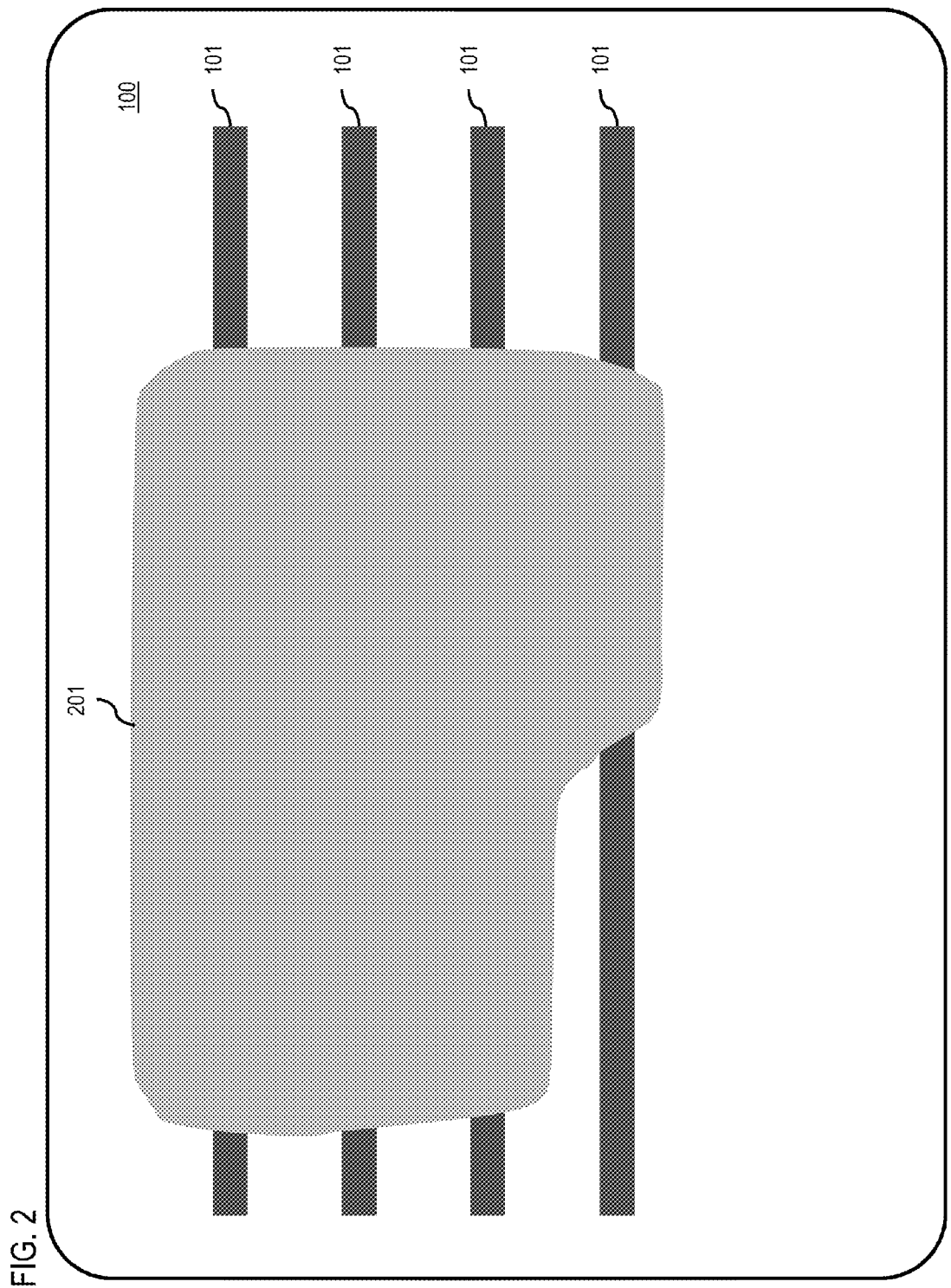

Next, a mask 201 is formed over the substrate 100, partially covering the fins 101, as illustrated in FIG. 2. The mask 201 may be a single cut mask, such as a corner rounding cut mask. The mask 201 may be formed of any material that acts as a mask.

Figure 3:
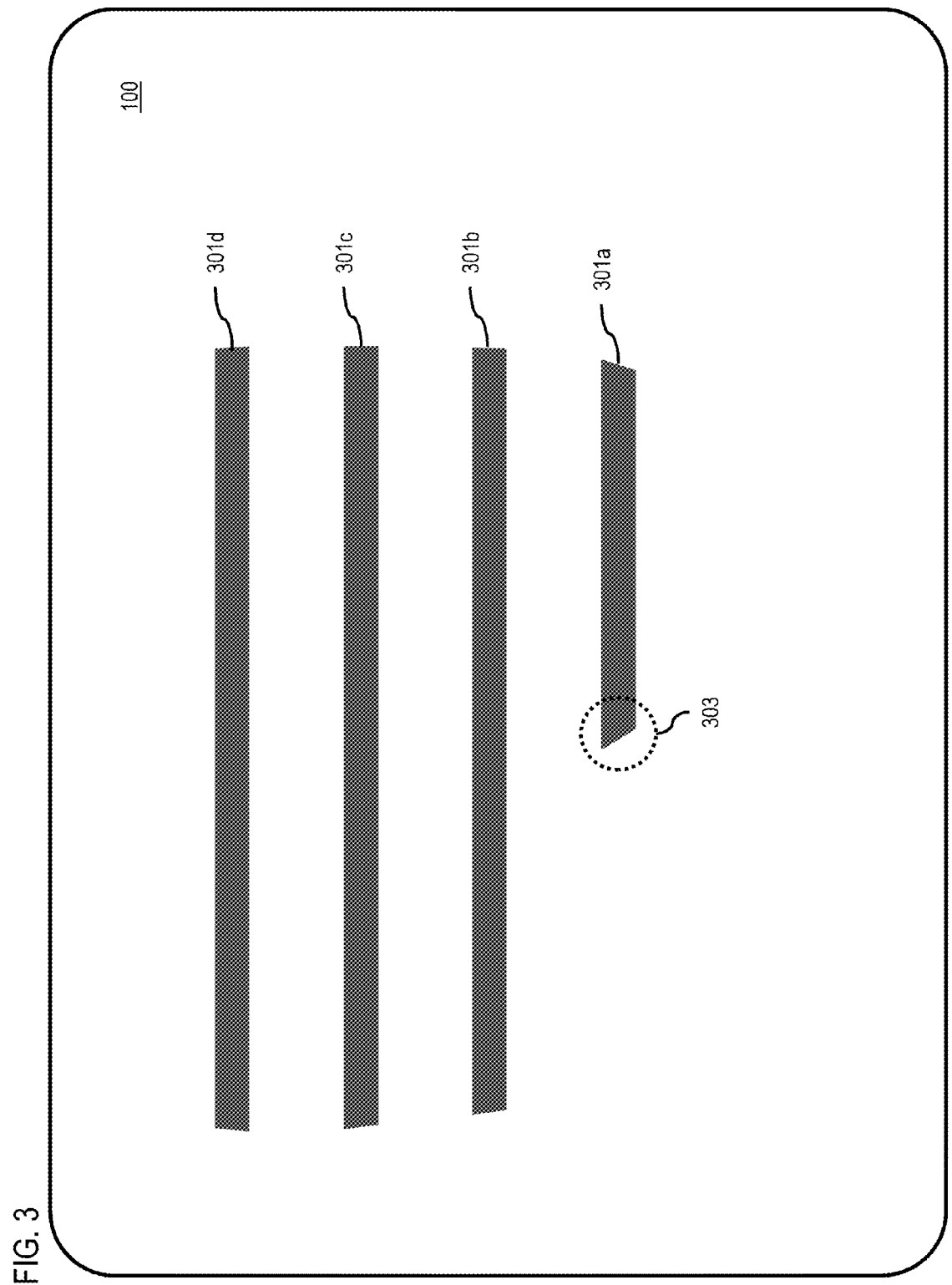

Adverting to FIG. 3, the fins 101 are removed where exposed by the mask 201, and the mask 201 is subsequently removed, forming partial fins 301a-301d. Although the mask 201 is described as a single mask, more than one mask may be used to form the partial fins 301a-301d. However, as discussed below, the current method allows for use of a single mask. Depending on the geometry of the mask 201, partial fins 301 may be formed that include oblique-angled ends, or fin tips, such as the fin tip 303 for the partial fin 301a. The fin tip 303 can be used as a source of localized higher electrical field when voltage is applied between a gate and silicon, allowing for a lower programming voltage of a resulting OTP memory. Specifically, the localized higher electrical field at the fin tip 303 allows for controlling the location of a breakdown in an oxide layer during programming of the OTP memory.

Figure 4:
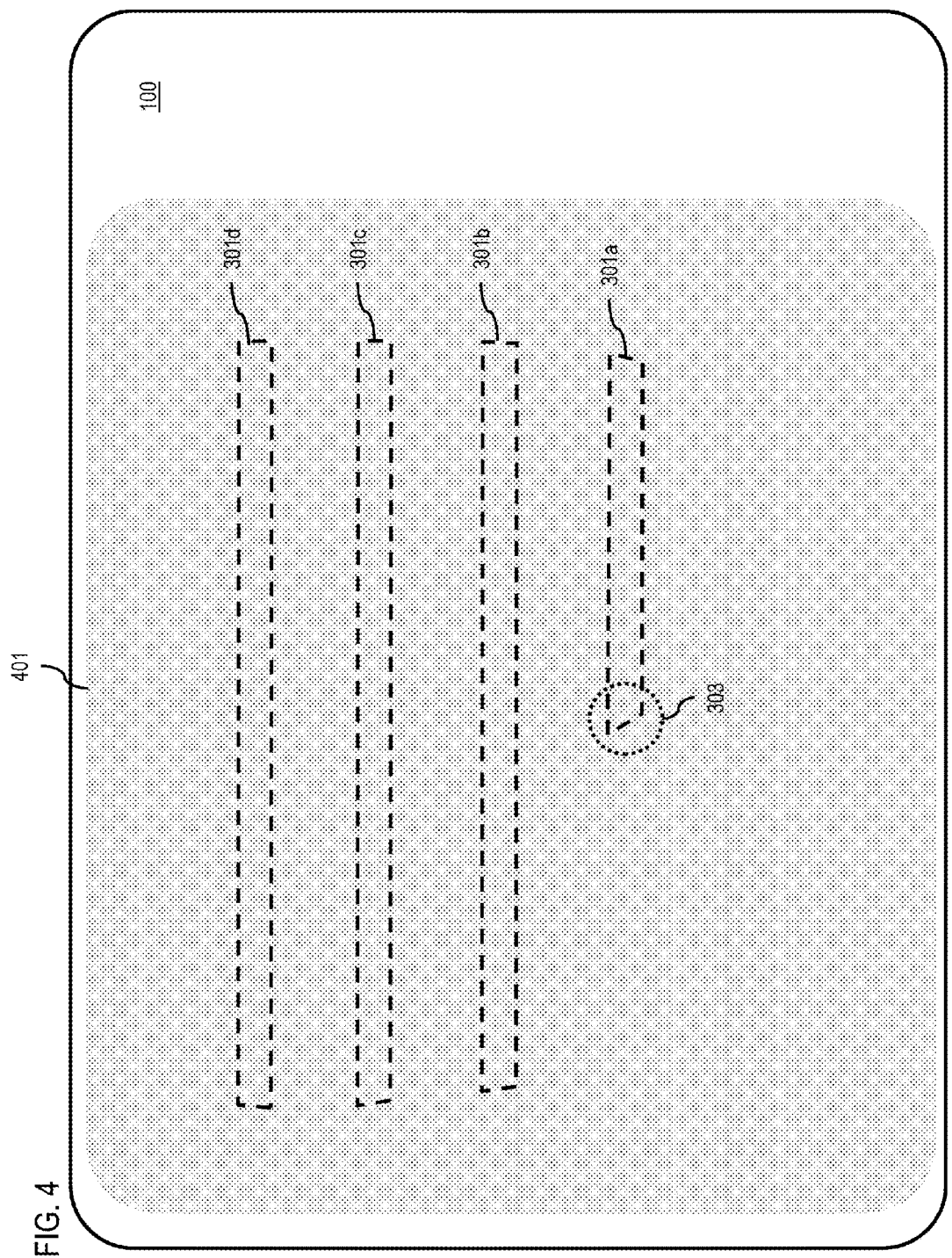

Next, a gate oxide layer 401 is formed over the substrate 100 and the partial fins 301a-301d, as illustrated in FIG. 4. The gate oxide layer 401 may be formed to a thickness of 20 to 55 Å and may be formed of one or more conventional oxides, such as one or more non-high k dielectrics.

Figure 5:
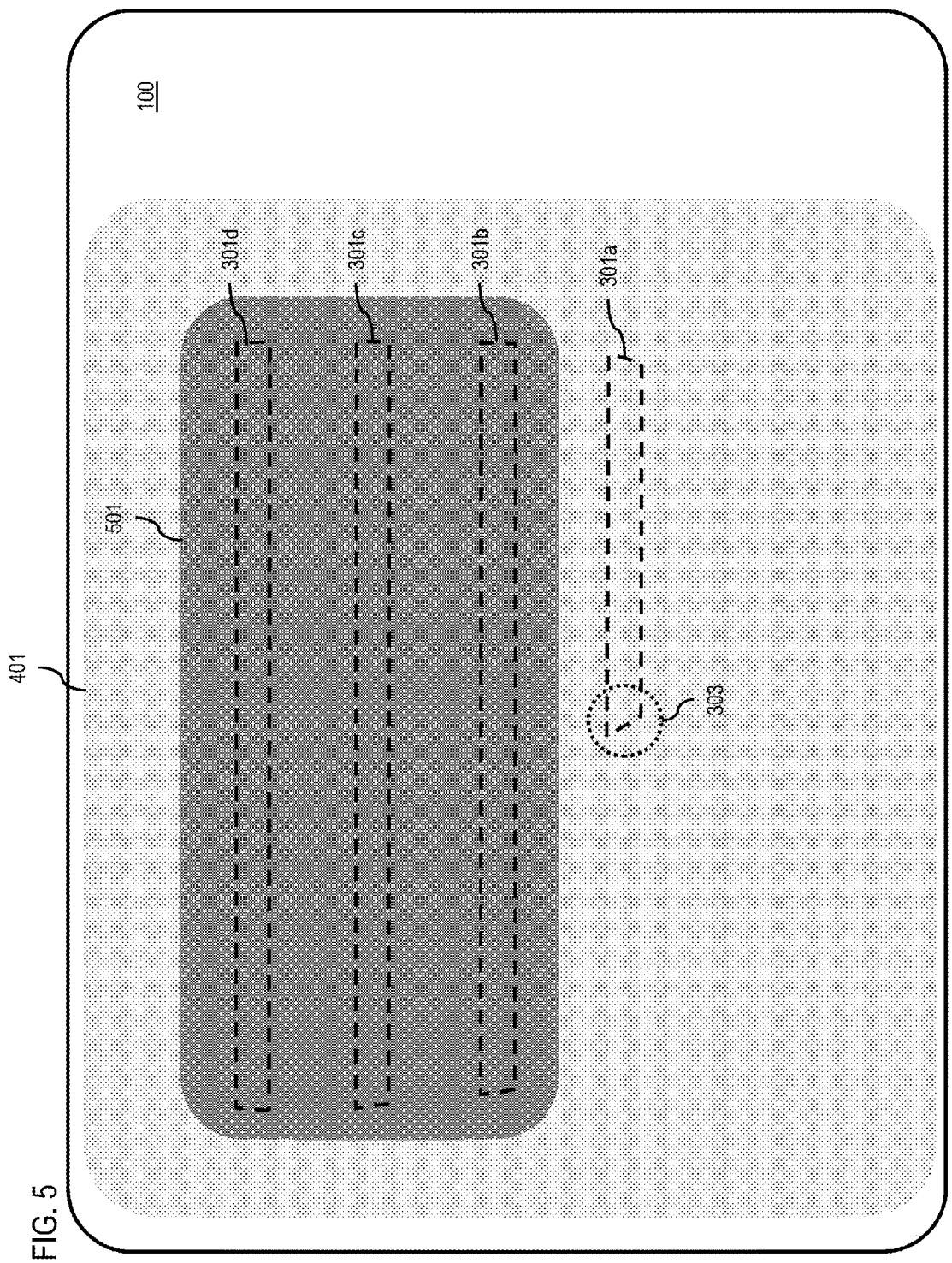
Figure 6:
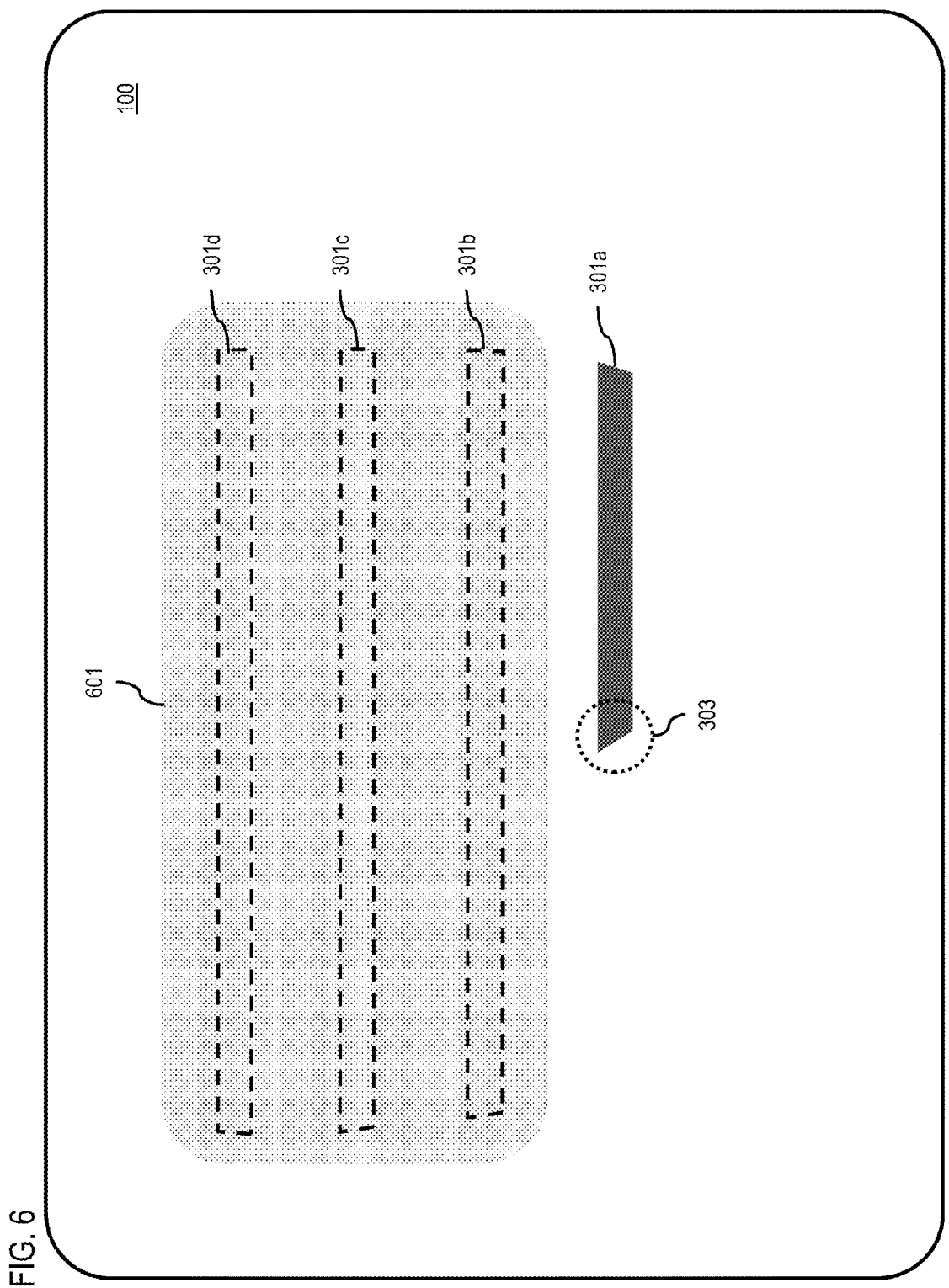

After forming the gate oxide layer 401, a mask 501 is formed over the gate oxide layer 401, as illustrated in FIG. 5. The mask 501 is formed to cover the partial fins 301b-301d and to expose the partial fin 301a and the fin tip 303. The mask 501 prevents part of the gate oxide layer 401 from being removed. Thus, the gate oxide layer 401 is removed where left exposed by the mask 501 to form a partial gate oxide layer 601, as illustrated in FIG. 6.

Figure 7:
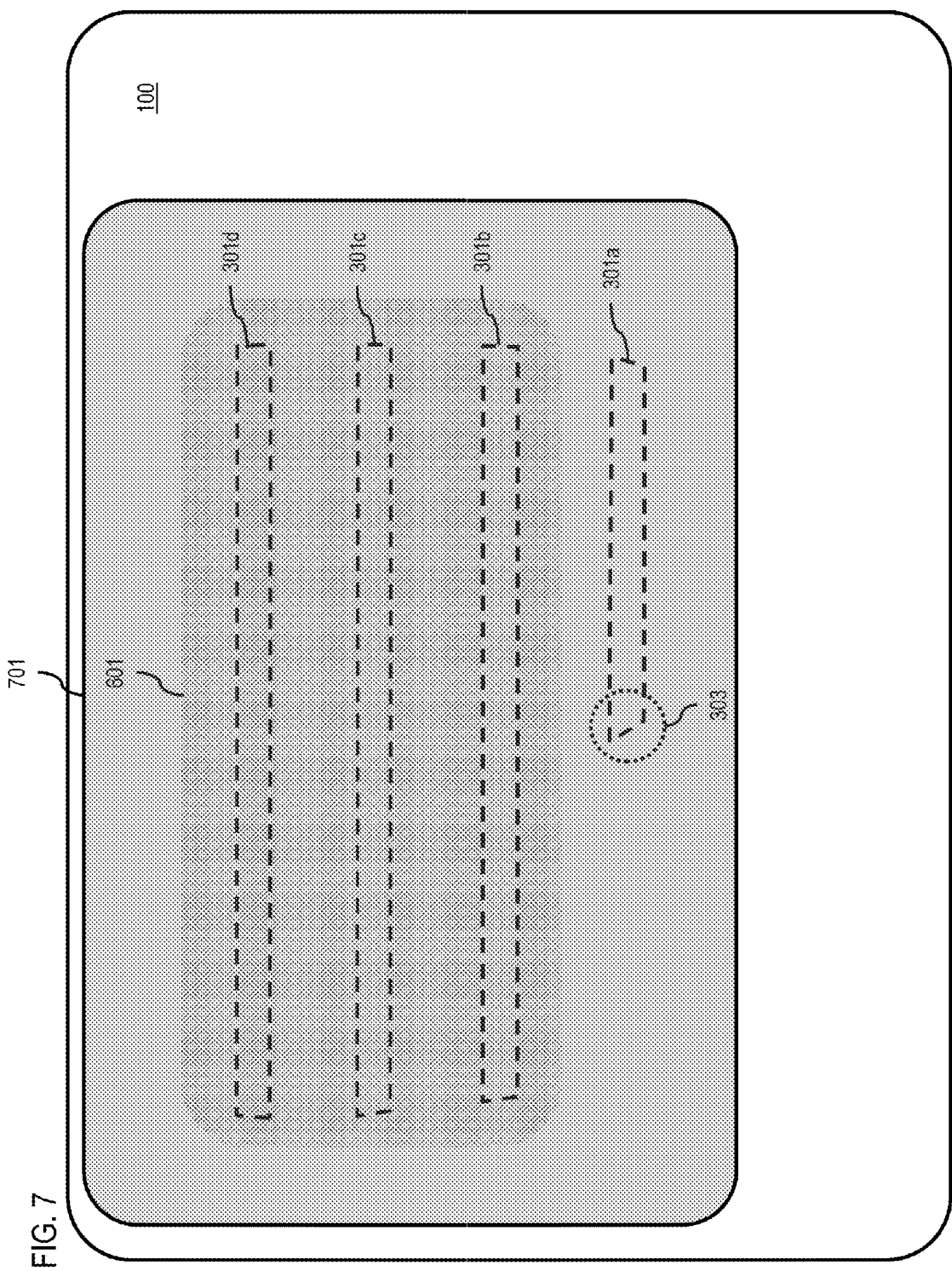

Adverting to FIG. 7, another gate oxide layer 701 is formed over the substrate 100, the partial gate oxide layer 601, and the partial fin 301a with the fin tip 303. The gate oxide layer 701 may be formed to a thickness of 10 to 15 Å and may be formed of a high-k dielectric.

Figure 8:
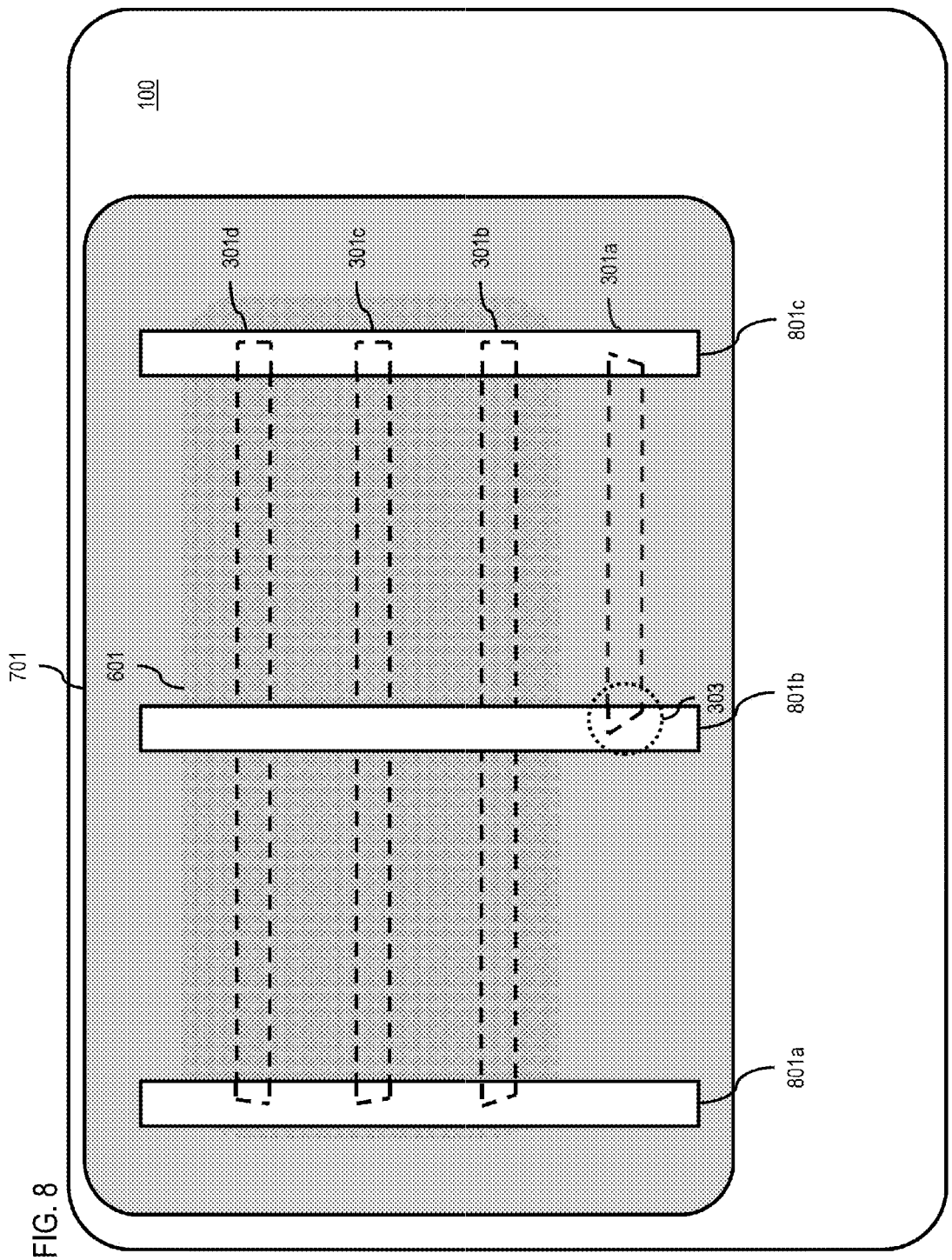

After forming the gate oxide layer 701, gates 801a-801c are formed over the gate oxide layer 701, with gate 801b formed over the fin tip 303, as illustrated in FIG. 8. While conventional logic gates may be formed to a width of 10 to 40 nm, gate 801b over the fin tip 303 may be formed to a width of 70 to 150 nm so that the gate 801b covers the entire fin tip 303.

Figure 9:
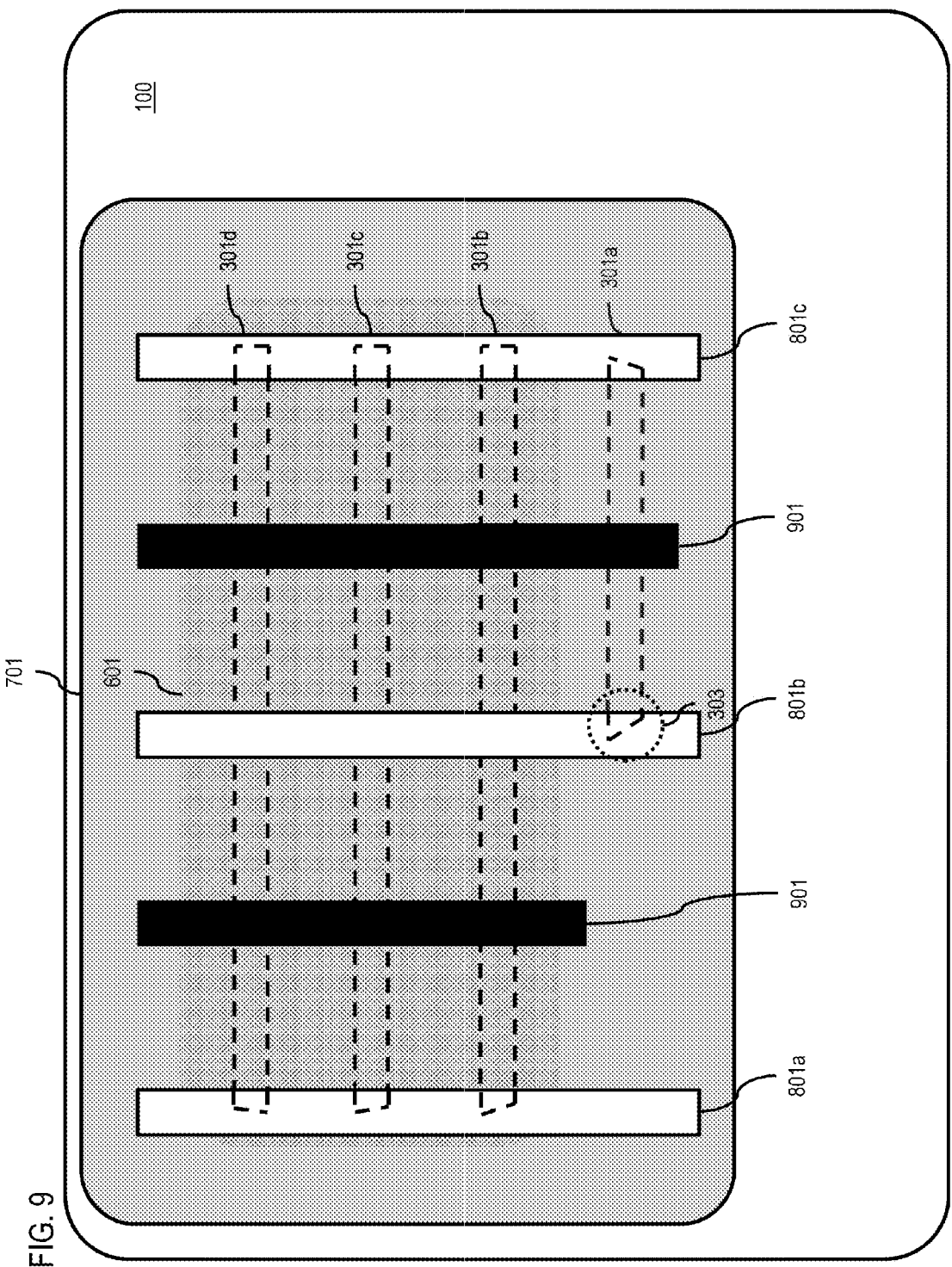

After forming the gates 801a-801c, contacts 901 for a source and a drain are formed between the gates 801a-801c extending across the partial fins 301a-301d, as illustrated in FIG. 9. The result is a partial fin 301a that acts as a capacitor for forming an OTP memory. Because of the thickness of the gate oxide layer 701 and the shape of the fin tip 303, the breakdown voltage of the gate oxide layer 701 may be the technology node logic nominal voltage, such as 0.9V, so that breakdown of the gate oxide layer 701 does not need the transmission or application of a higher voltage by design, which is typically the IO voltage such as 1.8V or 2.5V. Thus, the resulting OTP memory requires a lower programming voltage, which allows for a smaller area of circuitry to blow the antifuse and for a simple biasing scheme and a large sensing window.

The embodiments of the present disclosure achieve several technical effects, including an OTP memory with lower voltage requirements for programming with the ability to control the location of the breakdown in a gate oxide layer. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 20 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a plurality of fins above a substrate;
    removing a portion of a fin, forming a fin tip;
    forming a first area of a gate oxide layer above at least the fin tip;
    forming a second area of the gate oxide layer above a remaining portion of the plurality of fins, wherein the first area is thinner than the second area; and
    forming a gate over at least the fin tip to form an antifuse one-time programmable device.

2. The method according to claim 1, comprising:
    forming the second area to a thickness of 30 to 70 Angstroms (Å).

3. The method according to claim 1, comprising:
    forming the first area to a thickness of 10 to 15 Å.

4. The method of claim 1, comprising:
removing the portion of the fin using a corner rounding cut mask.

5. The method according to claim 4, wherein a breakdown voltage of the gate oxide layer at the fin tip is closer to the technology node logic nominal voltage as compared to the technology node IO voltage.

6. The method according to claim 1, comprising:
forming the gate to a width of 70 to 150 nanometers (nm).

7. The method according to claim 6, comprising:
forming the gate over the first area of the gate oxide layer above the fin tip.

8. The method according to claim 1, comprising:
forming the second area of the gate oxide layer of a high-k dielectric and a non-high-k dielectric.

9. The method according to claim 8, comprising:
forming the first area of the gate oxide layer of the high-k dielectric.

10. An apparatus comprising:
a substrate;
a plurality of fins above the substrate, at least one fin including a fin tip;
a gate oxide layer, the gate oxide layer including a first area above at least the fin tip and a second area above a remaining portion of the plurality of fins, wherein the first area is thinner than the second area; and
a gate over the fin tip.

11. The apparatus according to claim 10, comprising:
the second area having a thickness of 30 to 70 Angstroms (Å).

12. The apparatus according to claim 10, comprising:
the first area having a thickness of 10 to 15 Å.

13. The apparatus according to claim 10, wherein:
the fin tip comprises an oblique-angled end of the fin.

14. The apparatus according to claim 13, comprising:
the fin tip formed based on a corner rounding cut mask.

15. The apparatus according to claim 10, comprising:
the gate having a width of 70 to 150 nanometers (nm).

16. The apparatus according to claim 10, comprising:
the gate formed over the first area of the gate oxide layer above the fin tip.

17. The apparatus according to claim 10, comprising:
the second area of the gate oxide layer formed of a high-k dielectric and a non-high-k dielectric.

18. The apparatus according to claim 17, comprising:
the first area of the gate oxide layer formed of the high-k dielectric.

19. A method comprising:
forming a plurality of fins above a substrate;
removing a portion of a fin, forming a fin tip;
forming a first oxide layer over a first area and a second area, the first area covering at least the fin tip and the second area covering remaining fins of the plurality of fins;
forming a mask over the second area;
removing the first oxide layer in the first area;
forming a second oxide layer over the first area and the second area; and
forming a plurality of gates over the substrate and the plurality of fins, at least one gate formed over the fin tip forming an antifuse one-time programmable device.

20. The method according to claim 19, comprising:
forming the gate to a width of 70 to 150 nanometers (nm); and
removing the portion of the fin using a single corner rounding cut mask,
wherein the second oxide layer is formed of a high-k dielectric, and a breakdown voltage of the gate oxide layer at the fin tip is closer to the technology node logic nominal voltage as compared to the technology node IO voltage.

* * * * *